United States Patent Office 3,679,501

Patented July 25, 1972

3,679,501

METHOD OF POLISHING GALLIUM PHOSPHIDE

Richard J. Chicotka, Mahopac, N.Y., assignor to International Business Machines Corporation, Armonk, N.Y.

No Drawing. Filed Apr. 13, 1970, Ser. No. 28,059
Int. Cl. C09g *1/00;* H01l *7/00*
U.S. Cl. 156—17 10 Claims

ABSTRACT OF THE DISCLOSURE

A method of polishing gallium phosphide used in the manufacture of semiconductive devices. A gallium phosphide wafer is immersed in a solution consisting of from about 15 to 20 parts by volume of concentrated hydrofluoric acid and from about 3 to about 0.5 parts of concentrated nitric acid. Treatment by the HF-$HNO_3$ solution of this invention leaves the wafer substantially pit free with a mirror-like surface.

BACKGROUND OF THE INVENTION

Field of the invention

The present invention relates to polishing the surface of gallium phosphides, and more particularly to remove contaminants and to leave a relatively flawless gallium phosphide surface.

In the manufacture of semiconductive devices of gallium phosphide, it is necessary to remove a surface layer of the semiconductive material and to provide a smooth surface for subsequent epitaxial growth or a diffusion process. Such requirement of a smooth surface is particularly important in the preparation of light emitting diodes where planar p-n junctions are required in order to obtain efficient light output.

DESCRIPTION OF THE PRIOR ART

In the past, mechanical polishing has been used to obtain smooth surfaces. However, this method has shortcomings in that it leaves micro-scratches on the surfaces, polishing materials adhere or are embedded in the surfaces and the surfaces are often stained when solvents are used to wash away the adhering or embedded materials.

To overcome the shortcoming of mechanical polishing, chemical polishes are used. Chemical polishes have the advantages of not leaving impurities or residues on the surface, i.e., there is no pitting or staining and is relatively rapid in its action.

In the prior art, hydrofluoric acid and nitric acid etchants are generally used for etching semiconductive materials, particularly silicon and germanium. For example, in U.S. Pat. No. 3,231,422 there is disclosed an etchant useful for the etching of silicon which composition comprises a mixture of hydrofluoric acid (40% strength) and fuming nitric acid in a 1:1 ratio. However, while the above etchant is particularly useful in etching of silicon to improve the value of the blocking or peak-inverse voltage thereof, it has been found that it cannot polish the surface of gallium phosphide. When gallium phosphide is treated in the above etchant as prescribed in the above patent, it is found that the surface is badly pitted.

Similarly, U.S. Pats. 3,288,662, 3,272,748, 3,398,033 and 3,462,322 disclose HF-$HNO_3$ etchants for etching semiconductor materials, such as silicon, gallium and silicon-germanium alloys and the like. While the etchants disclosed in the above patents are useful for gross-etching, i.e., providing grooves in the surface of the semiconductor material for dicing the same, or for chemical polishing of silicon and germanium, they have not been found useful for the polishing of the surface of gallium phosphide wafers.

SUMMARY OF THE INVENTION

In accordance with the present invention, there is provided, a chemical etchant for polishing gallium phosphide (GaP) surfaces. The compositions of the etchant are, by volume, from about 15 to about 20 parts of concentrated HF and from about 3 to about 0.5 part of concentrated $HNO_3$. (The most preferable etching composition is within the following ranges: from about 18 to about 19 parts HF and from about 2 to about one parts $HNO_3$.)

The etching process comprises contacting the GaP surface with the afore-described etchant at 25° C. for about one hour. The GaP surface is non-preferentially attacked by the etchant. It removes the rough surface skin from the surface to expose a flat surface. The etchant thereafter chemically polishes the surface.

OBJECTS OF THE INVENTION

Accordingly, an object of this invention is to provide an etchant capable of polishing the surface of GaP.

A further object of this invention is to provide an etchant capable of polishing the surface of GaP, consisting essentially of, by volume, from about 15 to about 20 parts of concentrated HF and from about 3 to about 0.5 part of concentrated $HNO_3$.

The foregoing and other objects, features and advantages of this invention will become more apparent from the following more particular description of the preferred embodiments of the invention.

DESCRIPTION OF THE PREFERRED EMBODIMENTS

In the practice of the invention, GaP wafers are immersed in an etchant consisting of from about, by volume, 15 to about 20 parts of concentrated HF and from about 3 to about 0.5 part $HNO_3$. The wafers are immersed in the afore-described etchant for about 1 hour at about 25° C., after which the wafers are removed and washed in demineralized water. It is an essential element of this invention that the prescribed ranges of reagents be adhered to. For when one works without the prescribed ranges, it is found that polishing of the wafers does not occur. The surfaces remain rough and pitted.

The reagents used in this invention are either C.P. or electronic grade.

The following examples are for purposes of illustration only and are not to be construed as limitations upon the scope to which this invention is otherwise exhibited.

EXAMPLE I

A GaP wafer having a roughened surface is immersed in an etching solution consisting of, by volume, 18 parts of concentrated HF and 2 parts of concentrated $HNO_3$. The wafer is allowed to remain in the etching solution for about 1 hour after which it is removed and rinsed in water. The temperature of the etching solution is maintained at about 25° C. throughout the polishing operation. After 1 hour, the wafer is found to have a mirror-like surface, substantially free of pitting.

EXAMPLE II

GaP wafers were treated in a similar manner as in Example I except the etching solution consisted of 19 parts of HF to 1 part $HNO_3$. As in Example I, GaP wafers having mirror-like surfaces substantially free from pits were obtained.

EXAMPLE III

GaP wafers were treated in a similar manner as in Example II, except the etching solution consisted of 18 parts of HF to 2 parts $HNO_3$. As in Example II, GaP wafers having mirror-like surfaces substantially free from pits were obtained.

EXAMPLE IV

GaP wafers were treated in a similar manner as in Example III, except the etching solution consisted of 14 parts of HF to 4 parts $HNO_3$. The wafers were found not to be well polished, but remained pitted.

EXAMPLE V

GaP wafers were treated in a similar manner as in Example IV, except the etching solution consisted of 21 parts of HF to 0.4 part $HNO_3$. The wafer remained pitted.

EXAMPLE VI

For the purpose of comparison, an etchant solution such as that shown in U.S. Pat. No. 3,231,422 comprising a mixture of HF, in 40% concentration, and fuming $HNO_3$ in the ratio of 1:1 was used. The etchant was sprayed onto a GaP wafer for about 1 hour and constantly removed, and was subsequently subjected to the fumes of $HNO_3$. A blue coating did not develop on the wafer as suggested in the above patent. The surface of the GaP wafer was badly mottled and pitted.

While the invention has been particularly shown and described with reference to certain preferred embodiments thereof, it will be understood by those skilled in the art that the foregoing and other changes in form and details may be made therein without departing from the spirit and scope of this invention.

What is claimed is:

1. The method of polishing the surface of GaP which comprises the step of immersing said GaP into an etching solution consisting of, by volume, from about 15 to about 20 parts concentrated HF and from about 3 to about 0.5 parts of concentrated $HNO_3$.

2. A method according to claim 1 wherein said GaP remains immersed in said etching solution for about 1 hour.

3. A method according to claim 1 wherein said polishing of said surface of GaP is performed at a temperature of about 25° C.

4. A method according to claim 1 wherein said etching solution consists of, by volume, from about 18 to about 19 parts concentrated HF and about 2 to about 1 part $HNO_3$.

5. A method according to claim 1 wherein said etching solution consists of, by volume, about 18 parts concentrated HF and about 2 parts $HNO_3$.

6. A method according to claim 1 wherein said etching solution consists of, by volume, about 19 parts concentrated HF and about 1 part $HNO_3$.

7. An etching solution for polishing the surface of GaP consisting of about 15 to about 20 parts, by volume, of HF and about 3 to about 0.5 parts $HNO_3$.

8. An etching solution according to claim 7 wherein said HF is present in the range of about 18 to about 19 parts, by volume, and said $HNO_3$ is present in the amount of about 2 to about 1 parts by volume.

9. An etching solution according to claim 7 wherein said HF is present in the amount of about 18 parts, by volume, and said $NHO_3$ is present in the amount of about 2 parts, by volume.

10. An etching solution according to claim 7 wherein said HF is present in the amount of about 19 parts, by volume, and said $NHO_3$ is present in the amount of about 1 part, by volume.

References Cited

UNITED STATES PATENTS 3,272,748 9/1966 Szkudlapski ........ 252—79.3

OTHER REFERENCES

Etching of III–V Compounds by Faust, pp. 445 and 454.

Cmpd. Semiconductors, Preparation of III–V Cmpds. Rheinhold, 1963, HQC. J 82.

JACOB H. STEINBERG, Primary Examiner

U.S. Cl. X.R.

252—79.3